(12) United States Patent
Kaneko

(10) Patent No.: US 8,207,574 B2
(45) Date of Patent: Jun. 26, 2012

(54) SEMICONDUCTOR DEVICE AND METHOD FOR MANUFACTURING THE SAME

(75) Inventor: Nobuo Kaneko, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 181 days.

(21) Appl. No.: 12/698,458

(22) Filed: Feb. 2, 2010

(65) Prior Publication Data

US 2010/0244018 A1    Sep. 30, 2010

(30) Foreign Application Priority Data

Mar. 31, 2009    (JP) ................................. 2009-083944

(51) Int. Cl.
*H01L 29/66*    (2006.01)

(52) U.S. Cl. . 257/330; 257/194; 257/331; 257/E29.246; 438/172

(58) Field of Classification Search .................... 257/76, 257/192, 194, 268, 288, 329, 330, 331, 332, 257/33, 401, 407, E29.403, E29.246, E29.248, 257/E29.249, E29.252, E29.259, E21.403, 257/E21.407, 333; 438/167, 172, 175, 180, 438/182, 184, 689, 704, 706, 713, 734, 737, 438/738, 739, 743, 744, 745, 749, 756, 757
See application file for complete search history.

(56) References Cited

U.S. PATENT DOCUMENTS

| | | | |
|---|---|---|---|
| 6,159,861 A * | 12/2000 | Asai et al. ..................... | 438/706 |
| 6,180,440 B1 * | 1/2001 | Koganei ........................ | 438/167 |
| 7,419,862 B2 * | 9/2008 | Lim et al. ...................... | 438/197 |
| 2002/0185732 A1 * | 12/2002 | Ho et al. ........................ | 257/734 |
| 2007/0164322 A1 * | 7/2007 | Smith et al. ................... | 257/256 |
| 2007/0254418 A1 * | 11/2007 | Sheppard et al. ............. | 438/172 |
| 2009/0057720 A1 | 3/2009 | Kaneko | |
| 2009/0189187 A1 * | 7/2009 | Briere et al. .................. | 257/192 |
| 2010/0127275 A1 * | 5/2010 | Takehiko et al. .............. | 257/76 |
| 2010/0255646 A1 * | 10/2010 | Suh et al. ...................... | 438/172 |
| 2011/0089468 A1 * | 4/2011 | Zhang ........................... | 257/194 |

FOREIGN PATENT DOCUMENTS

JP    2007-149794    6/2007

* cited by examiner

*Primary Examiner* — Evan Pert
*Assistant Examiner* — Eduardo A Rodela
(74) *Attorney, Agent, or Firm* — Oblon, Spivak, McClelland, Maier & Neustadt, L.L.P.

(57) ABSTRACT

A object is to provide a semiconductor device having normally-off characteristics and capable of easily suppressing field concentration below a side surface of a concave portion. A device includes a nitride-based semiconductor layer having a concave portion formed in a part of one principal surface, a side surface of the concave portion being slanted; a first electrode provided on the principal surface; a second electrode on an opposite side to the first electrode across the concave portion, and provided on the principal surface; an insulating layer formed on both sides of the concave portion in the principal surface; and a control electrode provided on the concave portion and at least a part of the wall surface of the insulating layer on the concave portion-side. A tilt angle of the wall surface of the insulating layer is greater than a tilt angle of the side surface of the concave portion.

6 Claims, 7 Drawing Sheets

SEMICONDUCTOR DEVICE AND METHOD FOR MANUFACTURING THE SAME

CROSS REFERENCE TO RELATED APPLICATIONS AND INCORPORATION BY REFERENCE

This application is based upon and claims the benefit of priority from prior Japanese Patent Application P2009-083944 filed on Mar. 31, 2009; the entire contents of which are incorporated by reference herein.

TECHNICAL FIELD

The present invention relates to a semiconductor device including a nitride-based semiconductor layer and a method for manufacturing the semiconductor device.

BACKGROUND ART

There have been conventionally known a semiconductor device including a nitride-based semiconductor layer and a method for manufacturing the semiconductor device.

Patent Literature 1 discloses a semiconductor device (HJFET: Heterojunction Field Effect Transistor) including a substrate made of SiC, a buffer layer formed on the substrate, a channel layer made of GaN and formed on the buffer layer, a barrier layer made of ALGaN and formed on the channel layer, and a source electrode, a drain electrode and a gate electrode formed at different positions on the barrier layer, respectively. Furthermore, in the semiconductor device disclosed in Patent Literature 1, a concave portion is provided in the barrier layer between the channel layer and the gate electrode.

The semiconductor device disclosed in Patent Literature 1 uses a conductive oxide (such as ZnInSnO) having a higher work function than that of Ni or the like normally used for a gate electrode and eliminates a two-dimensional electron gas layer below the gate electrode, thereby making it possible to obtain normally-off characteristics.
Citation List
Patent Literature
  Patent Literature 1: Japanese Patent Laid-Open Publication No. 2007-149794

SUMMARY OF INVENTION

Technical Problem

According to the technique of Patent Literature 1, an opening is formed in an oxide film used as a mask for forming a drain electrode and a source electrode by wet etching using hydrofluoric acid. Next, a concave portion is formed by etching an exposed part of a barrier layer exposed by the opening. Thereafter, the gate electrode is formed to adjoin a bottom of the concave portion. However, the technique of Japanese Patent Laid-Open Publication No. 2007-149794 has a problem that, when the wet etching is used, a side surface of the concave portion is made steep, and thus field concentration occurs below the side surface of the concave portion.
Solution to Problem The present invention has been achieved to solve the conventional problem, and an object of the present invention is to provide a semiconductor device having normally-off characteristics and capable of easily suppressing field concentration below a side surface of a concave portion, and a method for manufacturing the semiconductor device.

First aspect of a semiconductor device of the invention includes a nitride-based semiconductor layer having a concave portion formed in a part of one principal surface, a side surface of the concave portion being slanted; a first electrode provided on the principal surface; a second electrode on an opposite side to the first electrode across the concave portion, and provided on the principal surface; an insulating layer formed on both sides of the concave portion in the principal surface, having a slanted wall surface on a concave portion-side; and a control electrode provided on a bottom and a side surface of the concave portion and at least a part of the wall surface of the insulating layer on the concave portion-side, wherein a tilt angle of the wall surface of the insulating layer is greater than a tilt angle of the side surface of the concave portion.

According to second aspect of the device of the invention, the nitride-based semiconductor layer includes a first nitride-based semiconductor layer, and a second nitride-based semiconductor layer different from the first nitride-based semiconductor layer at least in a composition, formed on the first nitride-based semiconductor layer, and having the concave portion formed therein, a two-dimensional electron gas layer is formed near an interface between the first nitride-based semiconductor layer and the second nitride-based semiconductor layer, and the bottom of the concave portion is out of reach of an interface of the first nitride-based semiconductor layer.

According to third aspect of the device of the invention, a gap is formed between the wall surface of the insulating layer and the concave portion, and an upper surface of the nitride-based semiconductor layer is exposed.

Fourth aspect of the device of the invention further includes a metal-oxide semiconductor layer on the bottom and the side surface of the concave portion and between the wall surface of the insulating layer on the concave portion-side and the control electrode.

First aspect of a method for manufacturing a semiconductor device of the invention, a method for manufacturing a semiconductor device includes steps of
  forming an insulating layer on one principal surface of a nitride-based semiconductor layer; forming a resist film on the insulating layer, the resist film being partially open; dry etching the insulating layer using the resist film as a mask; wet etching the insulating layer using the resist film as a mask, and forming a slanted wall surface of the insulating layer; dry etching the nitride-based semiconductor layer using the resist film as a mask, and forming a concave portion in the principal surface of the nitride-based semiconductor layer; and forming a control electrode on a bottom and a side surface of the concave portion and at least on a part of the slanted wall surface of the insulating layer on a concave portion-side.

Second aspect of the method of the invention further includes a step of forming a metal-oxide semiconductor layer between the control electrode and the bottom and the side surface of the concave portion and between the control electrode and the slanted wall surface of the insulating layer.
Advantageous Effects of Invention According to the present invention, a side surface of a concave portion is made to have a gentle slant, thereby making it possible to easily suppress field concentration below the side surface of the concave portion, while having normally-off characteristics.

DESCRIPTION OF EMBODIMENTS (First Embodiment)

Figure 1:
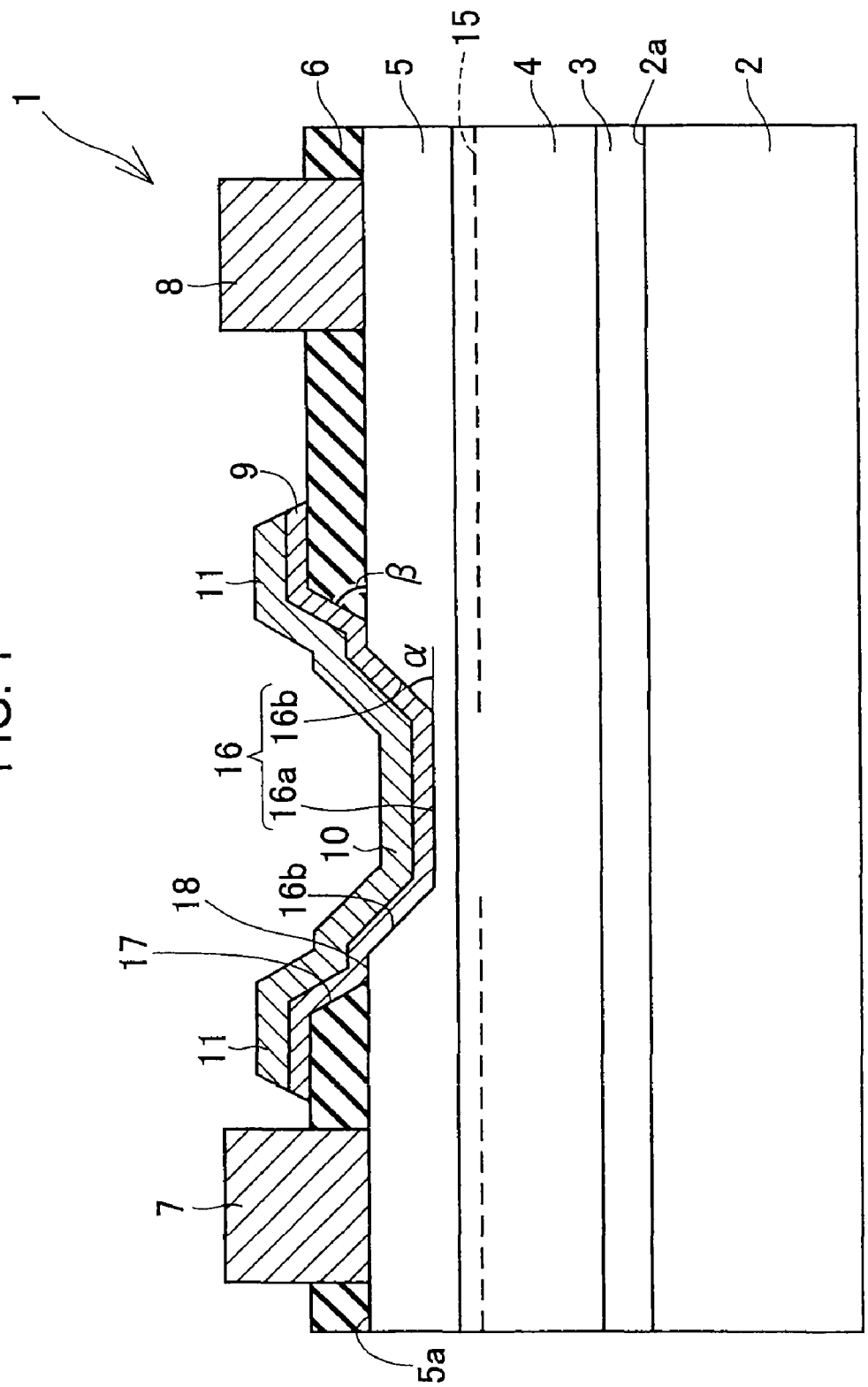
FIG. 1 is a cross-sectional view of a semiconductor device according to a first embodiment.

A first embodiment in which the present invention is applied to a high electron mobility transistor (HEMT) is described below with reference to the drawings. FIG. 1 is a cross-sectional view of a semiconductor device according to the first embodiment.

A semiconductor device 1 according to the first embodiment includes a substrate 2, a buffer layer 3, an electron transit layer 4 that is a first nitride-based semiconductor layer, an electron supply layer 5 that is a second nitride-based semiconductor layer, an insulating layer 6, a source electrode 7, a drain electrode 8, a metal-oxide semiconductor layer 9, a gate electrode 10, and a gate field plate 11.

The substrate 2 functions as a growth substrate for epitaxial growing the layers 3 to 5 on a growth principal surface 2a. The substrate 2 also functions as a support substrate mechanically supporting the constituent elements 3 to 11. The substrate 2 is made of silicon.

The buffer layer 3 narrows the differences in a lattice constant between the substrate 2 and the layers 3 to 5 and to relax stress. The buffer layer 3 is structured such that first sub-layers made of AlN (aluminum nitride) and second sub-layers made of GaN (gallium nitride) are formed alternately and periodically. The buffer layer 3 is formed on the growth principal surface 2a of the substrate 2.

The electron transit layer 4 forms a two-dimensional electron gas layer 15 that functions as a channel near a heterojunction surface with the electron supply layer 5. The electron transit layer 4 is made of undoped GaN that is not doped conductive impurities intentionally. The electron transit layer 4 has a thickness of about 0.3 μm to about 10 μm. The electron transit layer 4 is formed on the buffer layer 3.

The electron supply layer 5 supplies electrons to the electron transit layer 4. The electron supply layer 5 is made of undoped $Al_{0.3}Ga_{0.7}N$ that is not doped conductive impurities intentionally. The electron supply layer 5 has a thickness of about 10 nm to about 50 nm. Because the electron supply layer 5 is formed thin as described above, the electron transit layer 4 has a tunneling effect in a thickness direction. The electron supply layer 5 is formed on the electron transit layer 4. A concave portion 16 is formed in a central portion of one principal surface 5a of the electron supply layer 5. The concave portion 16 is formed so as to leave a part of the electron supply layer 5 between a bottom 16a of the concave portion 16 and the electron transit layer 4. A tilt angle α between a side surface 16b of the concave portion 16 and a horizontal surface (the growth principal surface 2a of the substrate 2) is set to about 45°. The tilt angle α is not limited to 45° but can be about 30° to 60°. An opening of the concave portion 16 is formed to have a width of 2.1 μm to 3.1 μm, and the bottom 16a of the concave portion 16 is formed to have a width of 2 μm to 3 μm.

The insulating layer 6 has a function to generate a compressive stress in itself and to increase a carrier concentration of the two-dimensional electron gas layer 15. Furthermore, the insulating layer 6 has a function as an ordinary protection film and a function to form the gate field plate as a slanted field plate on an upper surface and a wall surface 17 of the insulating layer 6. The insulating layer 6 is made of $SiO_2$. The insulating layer 6 has a thickness of about 300 nm to about 700 nm, preferably about 500 nm. The insulating layer 6 is formed on the principal surface 5a of the electron supply layer 5. In a cross-section shown in FIG. 1, the insulating layer 6 is formed on both sides of the concave portion 16. Furthermore, the insulating layer 6 is not formed in a region where the concave portion 16, a part (stepped portions 18) of the electron supply layer 5 extending from the opening of the concave portion 16 to the drain electrode 8 and to the source electrode 7, the source electrode 7, and the drain electrode 8 are formed. A tilt angle β between the concave portion 16-side wall surface 17 of the insulating layer 6 and the horizontal surface (the principal surface 5a of the electron supply layer 5) is set to about 60°. It suffices that the tilt angle β is greater than the tilt angle α. The tilt angle β is not limited to 60° but can be set to about 45° to 75°. The wall surface 17 of the insulating layer 6 is formed outside of the opening of the concave portion 16 (drain electrode 8-side and source electrode 7-side) at a predetermined distance (0.05 μm to 2.0 μm) from the concave portion 16. By so forming, the principal surface 5a of the electron supply layer 5 is exposed and the stepped portions 18 are formed between the wall surface 17 of the insulating layer 6 and the concave portion 16.

Each of the source electrode 7 and the drain electrode 8 is structured to stack a titanium (Ti) layer having a thickness of about 25 nm and an aluminum (Al) layer having a thickness of about 300 nm. The source electrode 7 and the drain electrode 8 are formed on the exposed principal surface 5a of the electron supply layer 5 on which the insulating layer 6 is not formed. The drain electrode 8 is formed on an opposite side to the source electrode 7 across the concave portion 16. As described above, the electron supply layer 5 is very thin, so that the tunneling effect enables the source electrode 7 and the drain electrode 8 to be electrically connected to the two-dimensional electron gas layer 15.

The metal-oxide semiconductor layer 9 improves normally-off characteristics and turn-on characteristics of the semiconductor device 1. The metal-oxide semiconductor layer 9 is made of a p-type nickel oxide (NiO). The metal-oxide semiconductor layer 9 has a thickness of about 200 nm. Note that the thickness of the metal-oxide semiconductor layer 9 is not limited to 200 nm but can be about 3 nm to about 1000 nm, preferably about 10 nm to about 500 nm. When the metal-oxide semiconductor layer 9 is thinner than 3 nm, the normally-off characteristics deteriorate. The metal-oxide semiconductor layer 9 is formed to cover the bottom 16a and the side surface 16b of the concave portion 16, exposed upper surfaces of the stepped portions 18 of the electron supply layer 5 on which the insulating layer 6 is not formed around the opening of the concave portion 16 and the wall surface 17 and a part of the upper surface of the insulating layer 6. The metal-oxide semiconductor layer 9 is formed to have a certain distance from each of the source electrode 7 and the drain electrode 8.

The gate electrode 10 controls a current flowing between the source electrode 7 and the drain electrode 8. The gate electrode 10 is structured to stack a nickel (Ni) layer having a thickness of about 25 nm and a gold (Au) layer having a thickness of about 300 nm. The gate electrode 10 is formed on the metal-oxide semiconductor layer 9 in a region opposed to the bottom 16a, the side surface 16b, and the stepped portions 18 of the concave portion 16.

The gate field plate 11 relaxes field concentration on ends of the gate electrode 10. The gate field plate 11 has the same material and the same stacking structure as those of the gate electrode 10. The gate field plate 11 is formed continuously and integrally with the gate electrode 10. That is, the gate field plate 11 is electrically connected to the gate electrode 10. The gate field plate 11 is formed on the metal-oxide semiconductor layer 9 provided on the wall surface 17 and the upper surface of the insulating layer 6, and is formed in a region extending from the gate electrode 10 to the source electrode 7 and the drain electrode 8 on which the gate electrode 10 is not formed. As described above, the wall surface 17 of the insulating layer 6 is slanted. With this structure, as the gate field plate 11 formed on the wall surface 17 becomes farther from the concave portion 16, a distance between the gate field plate 11 and the electron supply layer becomes gradually longer. As a result, an effect of relaxing the field concentration on the ends of the gate electrode 10 is improved.

With reference to the drawings, a method for manufacturing the semiconductor device 1 according to the first embodiment is explained next. FIGS. 2 to 10 are cross-sectional views of the semiconductor device in respective manufacturing steps.

First, the growth principal surface 2a of the substrate 2 made of silicon is preprocessed by hydrofluoric acid (HF)-based etchant. Next, the substrate 2 is introduced into a reaction chamber of an MOCVD (Metal Organic Chemical Vapor Deposition) device. The substrate 2 is then subjected to thermal annealing at a temperature of about 1100° C. for about ten minutes, thereby removing an oxide film on a surface of the substrate 2.

Next, TMA (trimethyl aluminium) gas and $NH_3$ (ammonium) gas are supplied into the reaction chamber to epitaxially grow an AlN layer on the growth principal surface 2a of the substrate 2. Thereafter, TMG (trimethylgallium) gas and $NH_3$ gas are supplied into the reaction chamber to epitaxially grow a GaN layer on the AlN layer. These processes are repeated for a desired number of times, thereby forming the buffer layer 3 shown in FIG. 2.

Next, the TMG gas and the $NH_3$ gas are supplied into the reaction chamber to form the electron transit layer 4 having the thickness of about 0.3 μm to about 10 μm and made of undoped GaN on the buffer layer 3.

Next, the TMA gas, the TMG gas, and the $NH_3$ gas are supplied into the reaction chamber to form the electron supply layer 5 having the thickness of about 25 nm and made of $Al_{0.3}Ga_{0.7}N$ on the electron transit layer 4.

Next, the substrate 2 completed with the above steps and having the buffer layer 3, the electron transit layer 4, and the electron supply layer 5 formed thereon is taken out from the MOCVD device.

Figure 2:
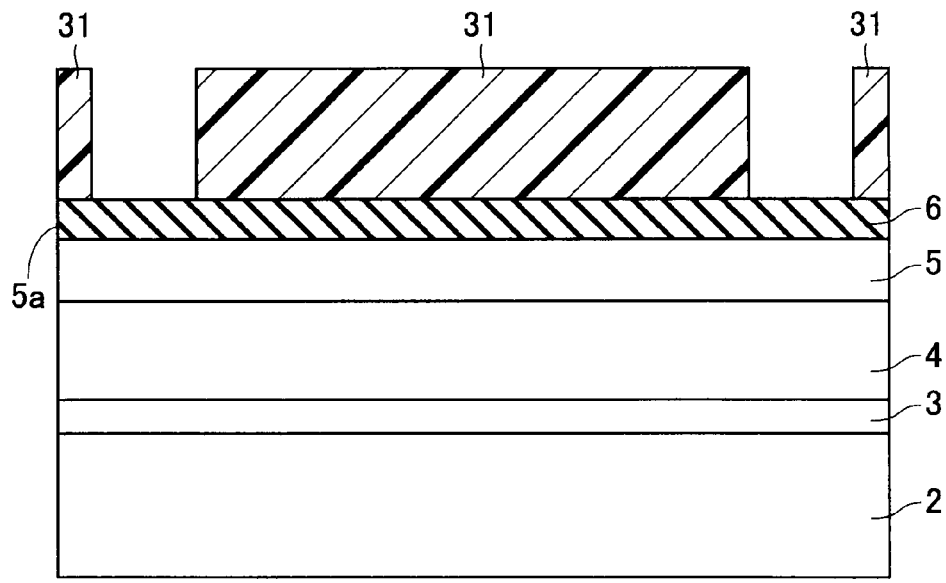
FIG. 2 is a cross-sectional view of the semiconductor device in a manufacturing step.

Next, as shown in FIG. 2, the insulating layer 6 having the thickness of about 500 nm and made of $SiO_2$ is formed on the principal surface 5a of the electron supply layer 5 by a plasma CVD (Chemical Vapor Deposition) method. Thereafter, a resist film 31 having openings for regions in which the source electrode 7 and the drain electrode 8 are to be formed is formed on the insulating film 6 by photolithography.

Figure 3:
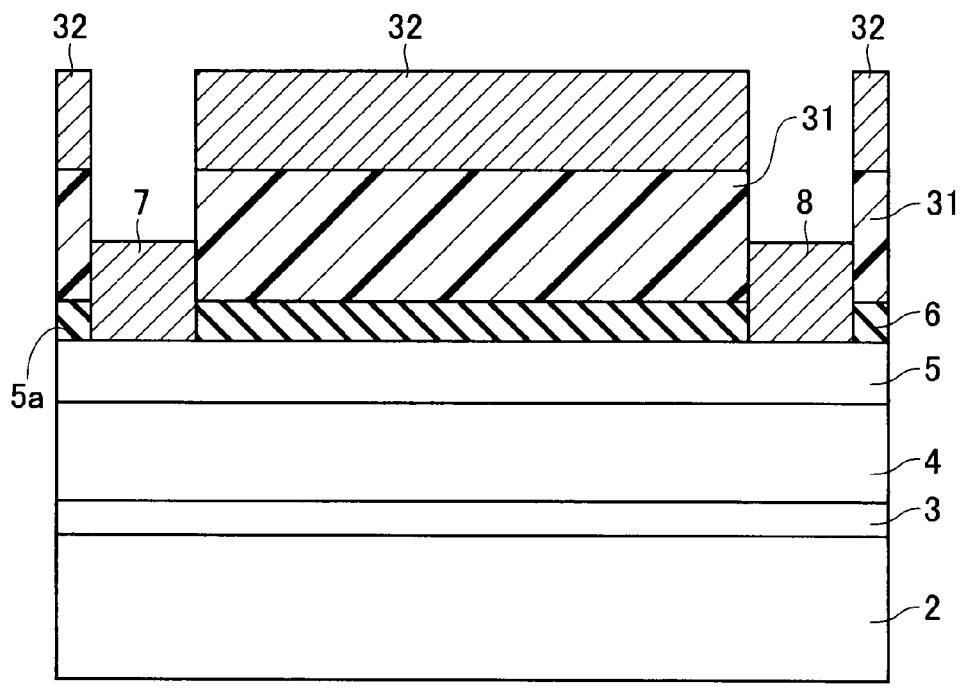
FIG. 3 is a cross-sectional view of the semiconductor device in another manufacturing step.

Next, as shown in FIG. 3, using the resist film 31 as a mask, openings for forming the source electrode 7 and the drain electrode 8 are formed in the insulating layer 6 by wet etching using HF-based etchant. Thereafter, a Ti layer and an Al layer are sequentially stacked by electron beam evaporation method. A metal film 32 on the resist film 31 as well as the resist film 31 is then removed (by a liftoff method). Annealing is performed at about 500° C. for 30 minutes in a $N_2$ (nitrogen) atmosphere, thereby forming ohmic-connection between the source electrode 7 and the drain electrode 8, and the electron supply layer 5. As a result, the source electrode 7 and the drain electrode 8 are completed.

Figure 4:
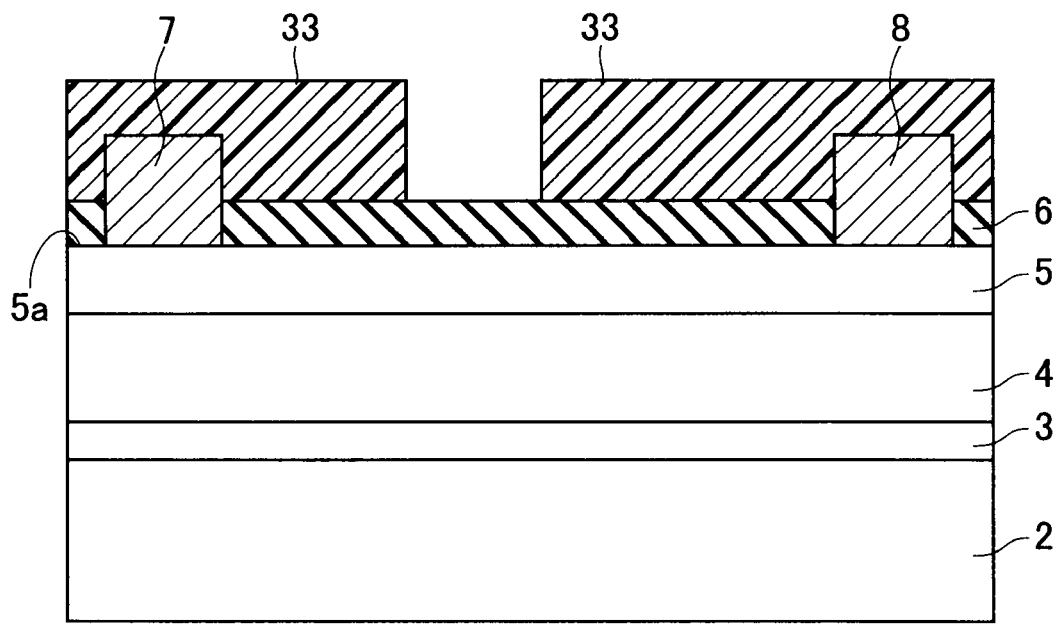
FIG. 4 is a cross-sectional view of the semiconductor device in still another manufacturing step.

Next, as shown in FIG. 4, a resist film 33 having an opening for forming a region where the gate electrode 10 is to be formed is formed on the insulating layer 6 by the photolithography. A width of the opening for the region where the gate electrode 10 is to be formed is set to 0.5 μm to 4 μm (for example, 2 μm).

Figure 5:
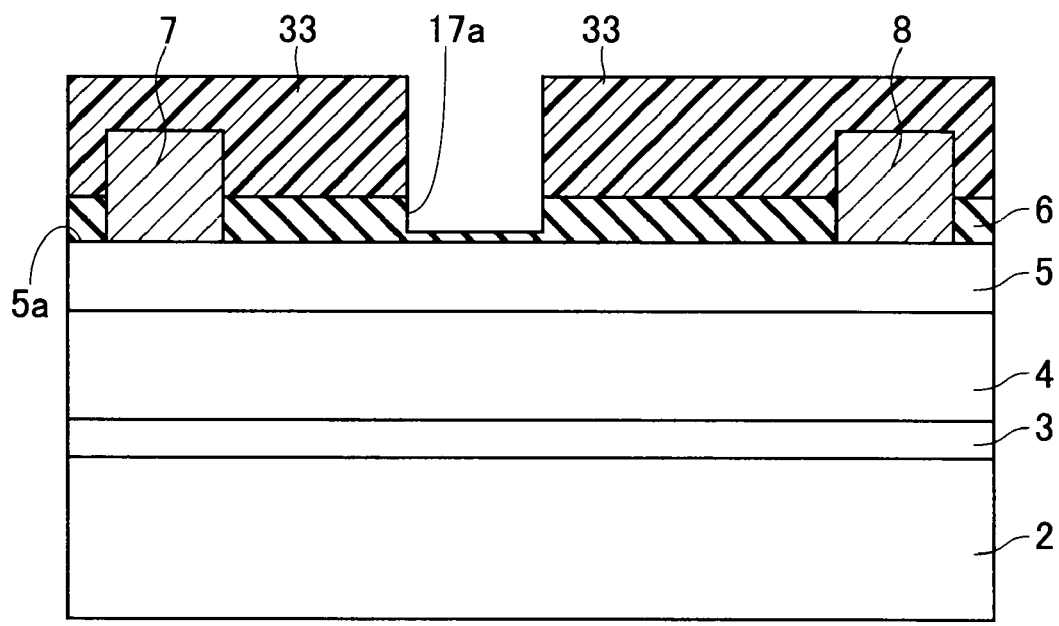
FIG. 5 is a cross-sectional view of the semiconductor device in still another manufacturing step.

Next, as shown in FIG. 5, using the resist film 33 as a mask, the insulating film 6 is subjected to plasma etching (dry etching) using $CF_4$, $CHF_3$ or the like. Because of the use of a plasma etching method, a wall surface 17a of the insulating layer 6 is almost vertical. The opening for forming the wall surface 17a is thereby made narrower as compared with an opening formed by conventional wet etching. The insulating layer 6 is etched so as to leave a part of about 50 nm to about 200 nm (for example, 100 nm) of the insulating layer 6 in the thickness direction even in an etched region.

Figure 6:
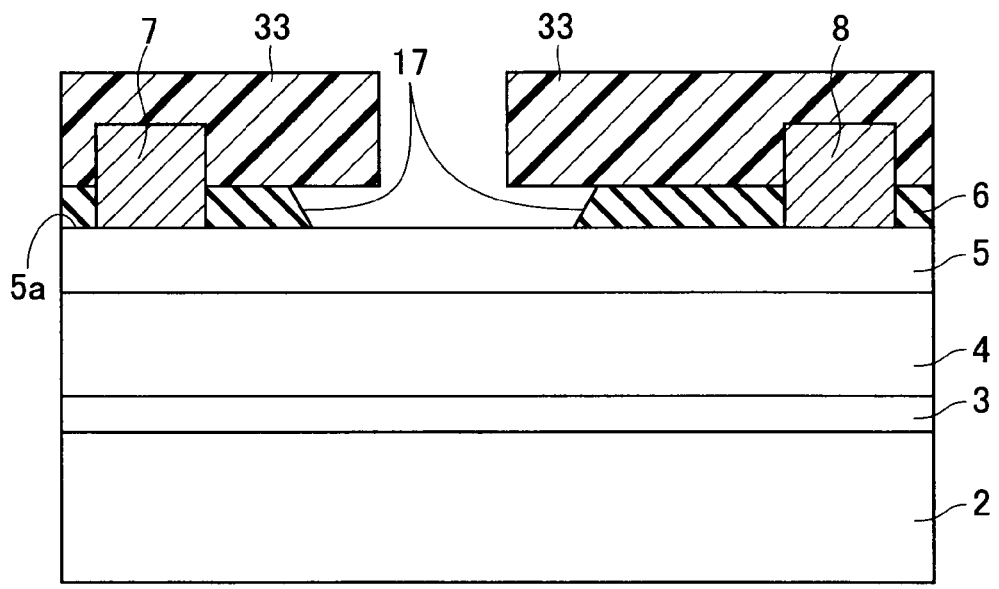
FIG. 6 is a cross-sectional view of the semiconductor device in still another manufacturing step.

Next, as shown in FIG. 6, using the same resist film 33 as a mask, a part of the insulating layer 6 left in the thickness direction shown in FIG. 5 is removed using hydrofluoric acid-based etchant. The insulating layer 6 is then wet etched until one principal surface 5a of the electron supply layer 5 is exposed by as much as a width of about 2.6 μm, thereby forming the wall surface 17 of the insulating layer 6. In this step, a wet etching method is used. However, the dry etching previously carried out makes the wall surface 17 of the insulating layer 6 have a steep slant. That is, the tilt angle β is greater as compared with formation of the wall surface of the insulating layer by conventional wet etching. Further, because the etchant sneaks down the resist film 33, the resist film 33 projects from an upper opening of the insulating layer 6 so that not only the upper opening but also a lower opening of the insulating layer 6 are larger than the opening of the resist film 33.

Figure 7:
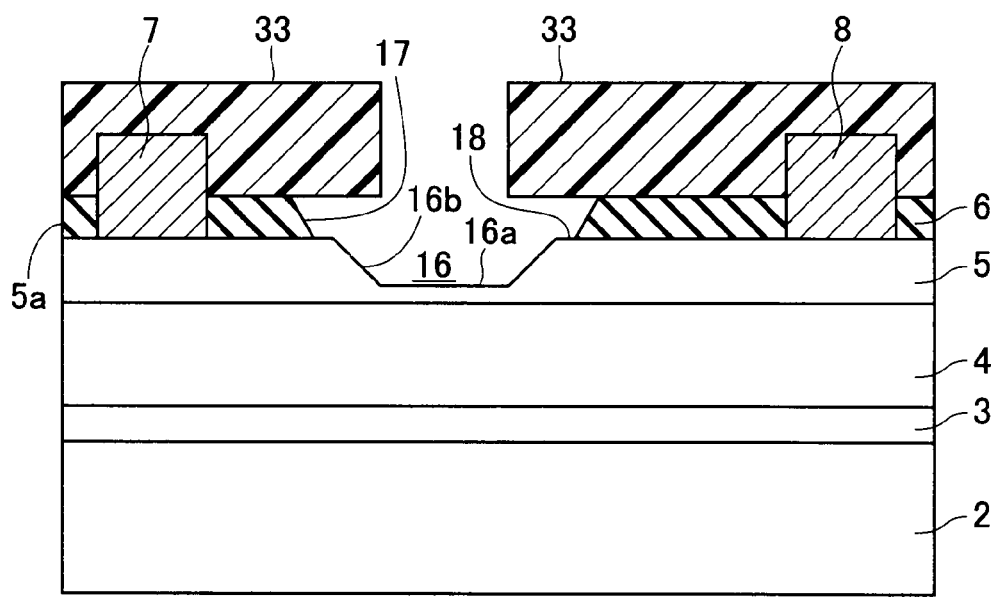
FIG. 7 is a cross-sectional view of the semiconductor device in still another manufacturing step.

Next, as shown in FIG. 7, using the resist film 33 used in the step shown in FIG. 6 as a mask as it is, one principal surface 5a of the electron supply layer 5 is subjected to plasma etching using chlorine gas, thereby forming the concave portion 16. The concave portion 16 has a depth of about 5 nm, and the principal surface 5a is etched so as to leave a part of the electron supply layer 5 under the bottom 16a of the concave portion 16. Because dry etching is used in this step, the bottom 16a of the concave portion 16 has a width corresponding to an opening width of the resist film 33. On the other hand, the principal surface 5a is etched such that the opening of the concave portion 16 is larger than that of the resist film 33, because the plasma gas sneaks down the resist film 33 and the side surface 16b of the concave portion 16 has a gentle slant. In this case, because a space as large as the thickness of the insulating layer 6 is formed between the resist film 33 and the electron supply layer 5 and the insulating layer 6 is not used as a mask, much plasma gas sneaks down an opening-side lower surface of the resist film 33. This makes the side surface 16b of the concave portion 16 have a gentler slant than that of the wall surface 17 of the insulating layer 6. Further, as shown in FIG. 7, the electron supply layer 5 is subjected to dry etching so as to leave a part (the stepped portions 18) of the exposed principal surface 5a of the electron supply layer 5 on which the insulating layer 6 is not formed.

Figure 8:
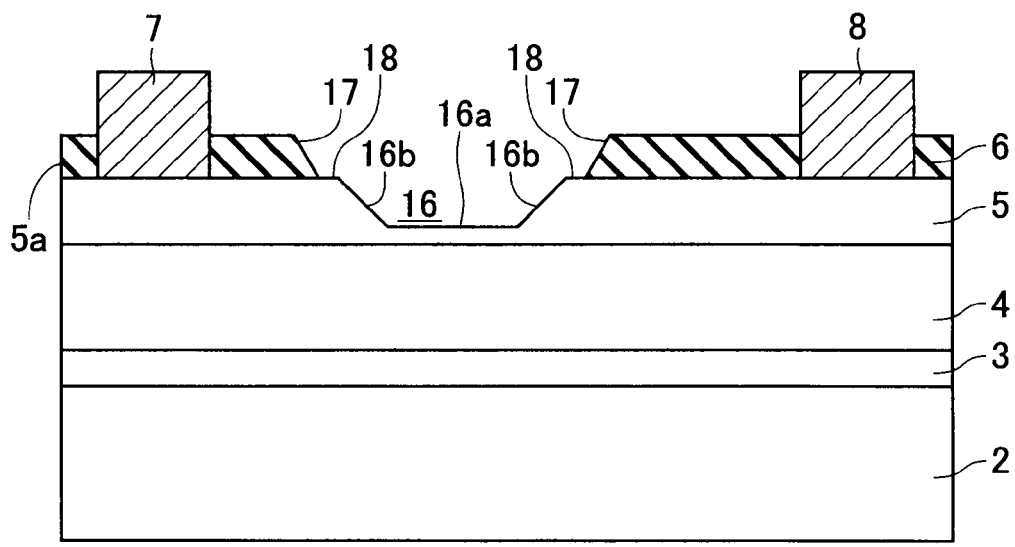
FIG. 8 is a cross-sectional view of the semiconductor device in still another manufacturing step.

Next, the resist film 33 is removed as shown in FIG. 8.

Figure 9:
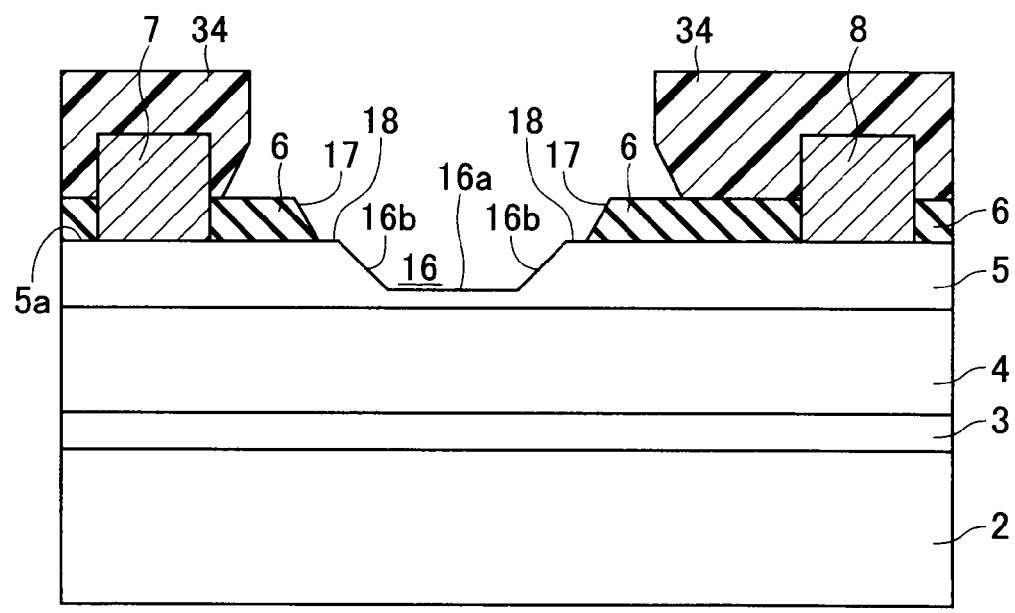
FIG. 9 is a cross-sectional view of the semiconductor device in still another manufacturing step.

Thereafter, as shown in FIG. 9, a resist film 34 having an opening for a region where the metal-oxide semiconductor layer 9 is to be formed is formed by the photolithography. The opening of the resist film 34 is larger than the lower opening of the insulating layer 6.

Figure 10:
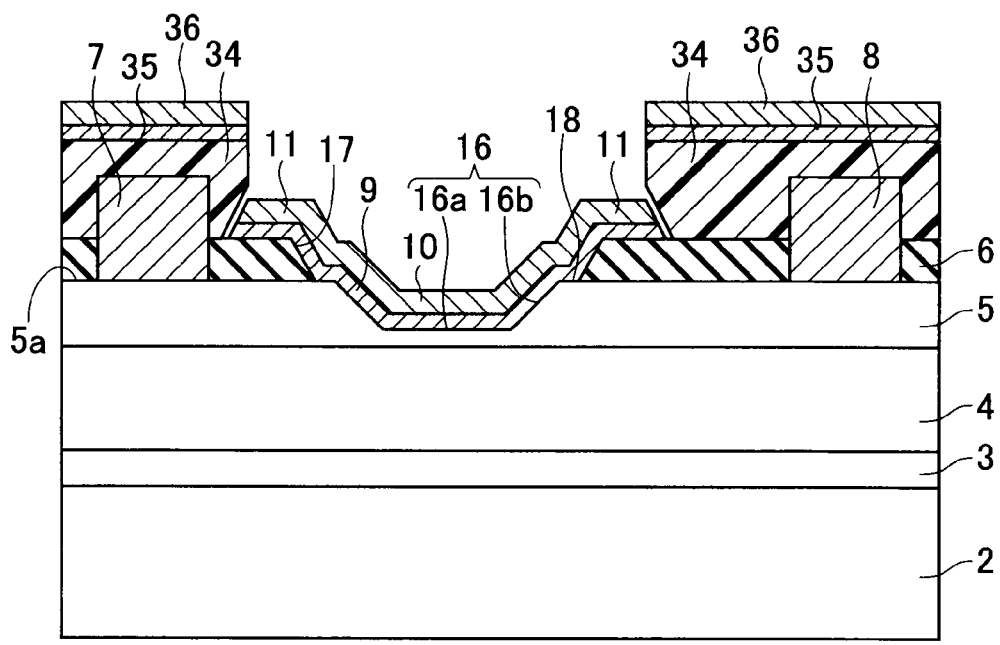
FIG. 10 is a cross-sectional view of the semiconductor device in still another manufacturing step.

Next, as shown in FIG. 10, NiO is subjected to magnetron sputtering in an oxygen-containing atmosphere, for example, in an atmosphere of mixture gas of argon and oxygen, thereby forming the metal-oxide semiconductor layer 9 made of NiO. Thereafter, to improve p-type characteristics of the metal-oxide semiconductor layer 9, heat treatment, ozone ashing treatment, oxygen ashing treatment or the like can be carried out. Next, a Ni (nickel) layer and an Au (gold) layer are sequentially stacked by magnetron sputtering, thereby forming the gate electrode 10 and the gate field plate 11.

Next, a metal-oxide semiconductor layer 35 and a metal film 36 on the resist film 34 shown in FIG. 10 as well as the resist film 34 are removed (by a liftoff method). As a result, as shown in FIG. 1, the metal-oxide semiconductor layer 9, the gate electrode 10, and the gate field plate 11 are completed.

Finally, the substrate 2 is sliced in a unit of devices by a well-known dicing step, thereby completing the semiconductor device 1 according to the first embodiment.

An operation performed by the semiconductor device 1 according to the first embodiment described above is explained next.

First, a voltage is applied between the drain electrode 8 and the source electrode 7 so that the drain electrode 8 has a high potential. In this state, when a desired control voltage higher than a threshold voltage is applied to the gate electrode 10, the metal-oxide semiconductor layer 9 is polarized. As a result, holes are collected toward the electron supply layer 5-side of the metal-oxide semiconductor layer 9 and electrons are induced toward a side of the electron transit layer 4 adjacent to the electron supply layer 5. A channel is formed in a region of the electron transit layer 4 opposed to the gate electrode 10. As a result, the state between the source electrode 7 and the drain electrode 8 turns into an ON state, and electrons flow on a path of the source electrode 7, the electron supply layer 5, the two-dimensional electron gas layer 15 of the electron transit layer 4, the electron supply layer 5, and the drain electrode 8. Note that the electrons pass through in the thickness direction by the tunneling effect, because the electron supply layer 5 is very thin. A current flows in an opposite direction to the path of the electrons. In this case, the control voltage applied to the gate electrode 10 controls magnitude of the current.

As described above, the metal-oxide semiconductor layer 9 is formed in the semiconductor device 1 according to the first embodiment. By forming the metal-oxide semiconductor layer 9 by sputtering (magnetron sputtering) in an oxygen-containing atmosphere, the metal-oxide semiconductor layer 9 can be easily formed and hole concentration can be increased. The metal-oxide semiconductor layer 9 can thereby raise a potential of a region below the gate electrode 10 to be able to suppress formation of the two-dimensional electron gas layer 15 on the electron transit layer 4 below the gate electrode during a normal time. As a result, the normally-off characteristics of the semiconductor device 1 can be easily improved.

Furthermore, in the semiconductor device 1, the tilt angle $\beta$ of the wall surface 17 of the insulating layer 6 is set greater than the tilt angle $\alpha$ of the side surface 16b of the concave portion 16. This can reduce regions where the wall surface 17 of the insulating layer 6 is thin, so that it is possible to suppress damage or breaking of the wall surface 17 of the insulating layer 6 resulting from the dry etching or the like in the manufacturing steps. Further, it is possible to further suppress damage or breaking of the wall surface 17 of the insulating layer 6, because the concave portion 16 is formed using not the insulating layer 6 but the resist film 33 as a mask.

Accordingly, a leakage current that is caused by damage or breaking of the insulating layer 6 and flows in the gate electrode 10 can be also suppressed, thereby making it possible to improve breakdown voltage.

Furthermore, in the semiconductor device 1, the tilt angle $\alpha$ of the side surface 16b of the concave portion 16 is set smaller than the tilt angle $\beta$ of the wall surface 17 of the insulating layer 6. This can relax field concentration below the side surface 16b of the concave portion 16.

Further, the metal-oxide semiconductor layer 9 and the gate electrode 10 are formed to cover the concave portion 16, the stepped portions 18, and the wall surface 17 of the insulating layer 6. This can relax field concentration near the gate electrode 10.

Moreover, in the method for manufacturing the semiconductor device 1, the insulating layer 6 and the concave portion 16 are etched using the same resist film 33, thereby making it possible to narrow the concave portion 16. This can further reduce ON resistance of the semiconductor device 1.

Further, in the method for manufacturing the semiconductor device 1, the concave portion 16 is formed by etching using the resist film 33 as a mask. This can further suppress damage or breaking of the insulating layer 6, as compared with a case of forming the concave portion 16 by etching using the insulating layer 6 as a mask.

(Second Embodiment)

Figure 11:
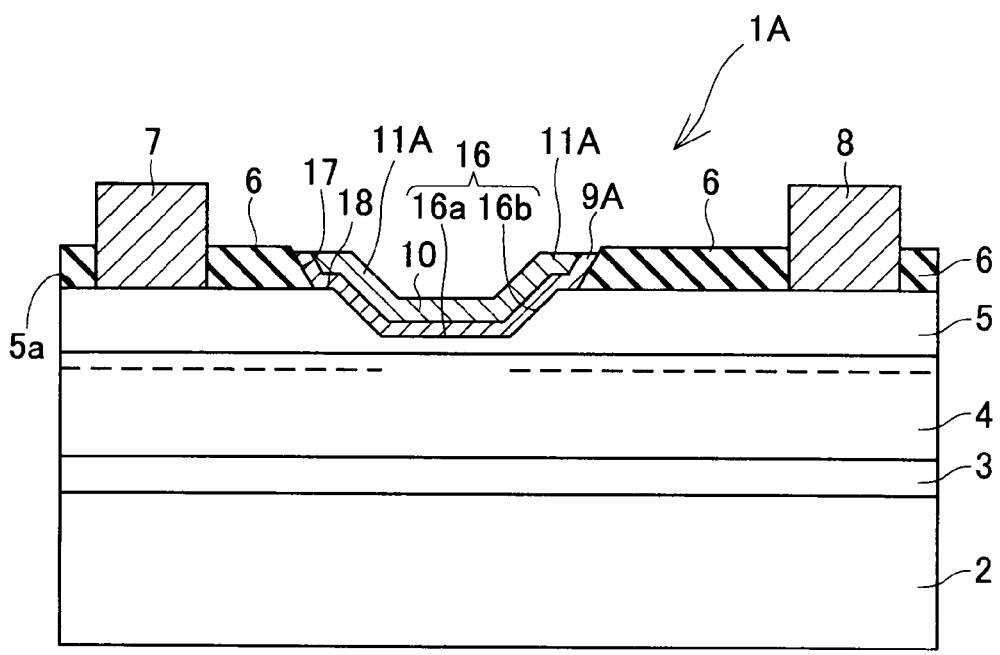
FIG. 11 is a cross-sectional view of a semiconductor device according to a second embodiment.

A second embodiment, which is a partial modification of the first embodiment, is described next with reference to the drawings. FIG. 11 is a cross-sectional view of a semiconductor device according to the second embodiment. In FIG. 11, like constituent elements as those according to the first embodiment are denoted by like reference symbols and redundant descriptions thereof will be omitted.

As shown in FIG. 11, a semiconductor device 1A according to the second embodiment differs from the semiconductor device 1 according to the first embodiment in that the semiconductor device 1A includes a metal-oxide semiconductor layer 9A and a gate field plate 11A.

Specifically, the metal-oxide semiconductor layer 9A and the gate field plate 11A are not formed on an upper surface of the insulating layer 6. That is, the metal-oxide semiconductor layer 9A and the gate field plate 11A are formed up to halfway along the wall surface 17 of the insulating layer 6.

(Third Embodiment)

Figure 12:
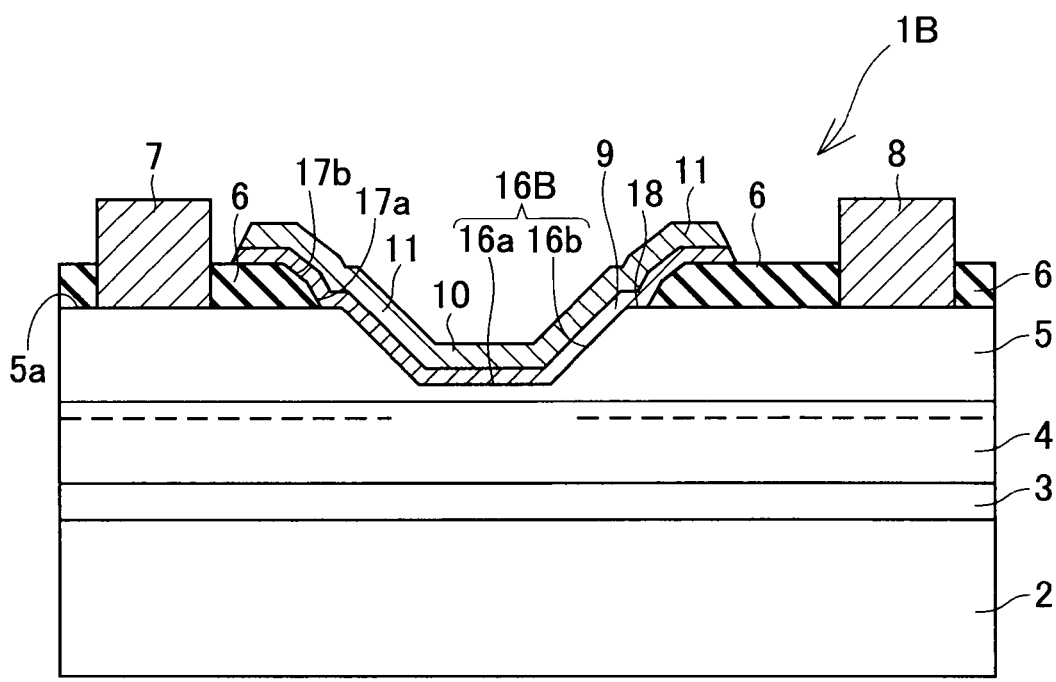
FIG. 12 is a cross-sectional view of a semiconductor device according to a third embodiment.

A third embodiment, which is a partial modification of the above embodiments, is described next with reference to the drawings. FIG. 12 is a cross-sectional view of a semiconductor device according to the third embodiment. In FIG. 12, like constituent elements as those according to the above embodiments are denoted by like reference symbols and redundant descriptions thereof will be omitted.

As shown in a semiconductor device 1B according to the third embodiment shown in FIG. 12, the wall surface of the insulating layer 6 can be formed to include the lower wall surface 17a and an upper wall surface 17b so as to further widen the opening of the insulating layer 6.

While exemplary embodiments of the present invention have been described above, the invention is not limited to the embodiments described in this specification. The scope of the present invention is defined by the descriptions of the appended claims and by the equivalent range of the claims. A modification mode, which is a partial modification of the above embodiments, is described below.

For example, materials, numerical values, shapes and the like described in the embodiments can be changed as appropriate.

In the above embodiments, the substrate 2 is made of silicon. Alternatively, the substrate 2 can be made of a semiconductor material such as silicon carbide (SiC) or an insulator such as sapphire or ceramics.

In the above embodiments, the buffer layer 3 is configured to have a stacking structure of AlN and GaN. Alternatively, the buffer layer 3 can be configured to have a stacking structure of other nitride-based semiconductor materials or III-V compound semiconductor materials, or a monolayer structure of a semiconductor material.

In the above embodiments, the electron transit layer 4 is made of GaN. Alternatively, the electron transit layer 4 can be made of other nitride-based semiconductor materials or compound semiconductor materials. By way of example, the electron transit layer 4 can be made of $Al_a In_b Ga_{1-a-b}N$, where $0 \leq a < 1$ and $0 \leq b < 1$.

In the above embodiments, the electron supply layer 5 is made of $Al_{0.3}Ga_{0.7}N$. Alternatively, the electron supply layer 5 can be made of other nitride-based semiconductor materials or compound semiconductor materials. By way of example, the electron supply layer 5 can be made of $Al_x In_y Ga_{1-x-y}N$, where $0 < x < 1$ (preferably, $0.1 < x < 0.4$) and $0 \leq y < 1$.

In another alternative, the electron supply layer 5 can be made of $Al_x In_y Ga_{1-x-y}N$ doped with n-type impurities. It is preferable that the electron supply layer 5 is made of a semiconductor material having a wider band gap than that of the electron transit layer 4 and having a lower lattice constant than that of the electron transit layer 4.

In the above embodiments, the electron transit layer 4 and the electron supply layer 5 are made of a nitride-based semiconductor material. Alternatively, the electron transit layer 4 and the electron supply layer 5 can be configured to have a heterostructure of materials other than the nitride-based semiconductor material such as AlGaAs/GaAs.

In the above embodiments, the insulating layer 6 is made of $SiO_2$. Alternatively, the insulating layer 6 can be made of other silicon oxide (such as $SiO_x$) or insulating materials such as a silicon nitride ($SiN_x$).

In the above embodiments, the source electrode 7 and the drain electrode 8 are configured to have a stacking structure of titanium and aluminum. Alternatively, the source electrode 7 and the drain electrode 8 can be made of other metals that can ohmic-contact with each other.

In the above embodiments, the metal-oxide semiconductor layer 9 or 9A is made of NiO. Alternatively, the metal-oxide semiconductor layer 9 or 9A can be made of other metal oxide semiconductors. Examples of applicable metal oxide semiconductors include iron oxide, cobalt oxide, manganese oxide and copper oxide. Furthermore, the metal-oxide semiconductor layer 9 or 9A can have a multilayer structure in which a plurality of the materials mentioned above are stacked. In this case, the structure can be a multilayer structure in which a concentration of p-type (or n-type) impurities gradually changes in the thickness direction. Further, the gate electrode 10 can be made of a Schottky electrode material without arranging the metal-oxide semiconductor layer 9 or 9A. Further, the metal-oxide semiconductor layer 9 or 9A can be replaced by a p-type semiconductor layer such as a p-GaN layer. When the nitride-based semiconductor layer of the electron supply layer 5 is made of the p-type semiconductor material, the metal-oxide semiconductor layer 9 or 9A can be made of an n-type semiconductor material.

In the above embodiments, the gate electrode 10 is made of Ni and Au. Alternatively, the gate electrode 10 can be configured to have a three-layer structure of Ni, Au and Ti, or formed by an aluminum layer, a polysilicon layer having electrical conductivity or the like.

While the above embodiments have explained an example in which the stepped portions 18 are formed between the insulating layer 6 and the concave portion 16 or 16B, the stepped portions 18 can be omitted.

Moreover, an insulating film made of HfO or $SiO_x$ and thinner than the metal-oxide semiconductor layer 9 or 9A can be formed between the metal-oxide semiconductor layer 9 or 9A and the gate electrode 10 or between the electron supply layer 5 and the metal-oxide semiconductor layer 9 or 9A.

In the above embodiments, the metal-oxide semiconductor layer 9 or 9A, the gate electrode 10, and the gate field plate 11 or 11A are formed into the same shape. Alternatively, these elements can be formed into different shapes. When the metal-oxide semiconductor layer 9 or 9A, the gate electrode 10, and the gate field plate 11 or 11A are formed into different shapes, these elements can be formed using different resist films, respectively.

In the above embodiments, the resist film 33 for forming the insulating layer 6 is used as a mask when the concave portion 16 or 16B are formed. Alternatively, after removing the resist film 33, the concave portion 16 or 16B can be etched using the insulating film 6 as a mask.

Furthermore, in the above embodiments, an instance of applying the present invention to an HEMT has been described. Alternatively, the present invention can be applied to an MESFET (Metal-Semiconductor Field Effect Transistor: Schottky gate field effect transistor), an insulated gate effect transistor, a diode or the like.

Industrial Applicability

The present invention can be used for a semiconductor device including a nitride-based semiconductor layer and a method for manufacturing the semiconductor device.

Reference Sings List 1, 1A, 1B Semiconductor device
2 Substrate
2a Growth principal surface
3 Buffer layer
4 Electron transit layer
5 Electron supply layer
5a Principal surface
6 Insulating layer
7 Source electrode
8 Drain electrode
9, 9A Metal-oxide semiconductor layer
10 Gate electrode
11, 11A Gate field plate
15 Two-dimensional electron gas layer
16, 16B Concave portion
16a Bottom
16b Side surface
17 Wall surface
17a Wall surface
18 Stepped portion
31, 33, 34 Resist film
32 Metal film
35 Metal-oxide semiconductor layer
36 Metal film α Tilt angle
β Tilt angle

The invention claimed is:

1. A semiconductor device comprising:
a nitride-based semiconductor layer having a concave portion formed in a part of one principal surface, a side surface of the concave portion being slanted;
a first electrode provided on the principal surface;
a second electrode on an opposite side to the first electrode across the concave portion, and provided on the principal surface;
an insulating layer formed on both sides of the concave portion in the principal surface, having a slanted wall surface on a concave portion-side; and
a control electrode provided on a bottom and a side surface of the concave portion and at least a part of the wall surface of the insulating layer on the concave portion-side, wherein
a tilt angle relative to the horizontal axis of the wall surface of the insulating layer is greater than a tilt angle relative to the horizontal axis of the side surface of the concave portion on a same side as the tilt angle of the wall surface of the insulating layer.

2. The semiconductor device according to claim 1, wherein the nitride-based semiconductor layer includes
a first nitride-based semiconductor layer, and
a second nitride-based semiconductor layer different from the first nitride-based semiconductor layer at least in a composition, formed on the first nitride-based semiconductor layer, and having the concave portion formed therein,
a two-dimensional electron gas layer is formed near an interface between the first nitride-based semiconductor layer and the second nitride-based semiconductor layer, and
the bottom of the concave portion is out of reach of an interface of the first nitride-based semiconductor layer.

3. The semiconductor device according to claim 1, wherein a gap is formed between the wall surface of the insulating layer and the concave portion, and an upper surface of the nitride-based semiconductor layer is exposed.

4. The semiconductor device according to claim 1, further comprising a metal-oxide semiconductor layer on the bottom and the side surface of the concave portion and between the wall surface of the insulating layer on the concave portion-side and the control electrode.

5. A method for manufacturing a semiconductor device, comprising steps of:
forming an insulating layer on one principal surface of a nitride-based semiconductor layer;
forming a resist film on the insulating layer, the resist film being partially open;
dry etching the insulating layer using the resist film as a mask;
wet etching the insulating layer using the resist film as a mask, and forming a slanted wall surface of the insulating layer;
dry etching the nitride-based semiconductor layer using the resist film as a mask, and
forming a concave portion in the principal surface of the nitride-based semiconductor layer so that a tilt angle relative to the horizontal axis of the wall surface of the insulating layer is greater than a tilt angle relative to the horizontal axis of a side surface of the concave portion on a same side as the tilt angle of the wall surface of the insulating layer; and
forming a control electrode on a bottom and a side surface of the concave portion and at least on a part of the slanted wall surface of the insulating layer on a concave portion-side.

6. The method for manufacturing a semiconductor device according to claim 5, further comprising a step of forming a metal-oxide semiconductor layer between the control electrode and the bottom and the side surface of the concave portion and between the control electrode and the slanted wall surface of the insulating layer.

* * * * *